United States Patent [19]

Usui

[11] Patent Number: 5,179,435

[45] Date of Patent: Jan. 12, 1993

[54] RESIN SEALED SEMICONDUCTOR INTEGRATED CIRCUIT DEVICE

[75] Inventor: Toshimasa Usui, Tokyo, Japan

[73] Assignee: NEC Corporation, Japan

[21] Appl. No.: 662,752

[22] Filed: Mar. 1, 1991

[30] Foreign Application Priority Data

Mar. 5, 1990 [JP] Japan .................................. 2-54095

[51] Int. Cl.⁵ ............................................ H01L 23/28
[52] U.S. Cl. ...................................... 257/758; 257/787
[58] Field of Search ...................... 357/65, 68, 70, 71, 357/72

[56] References Cited

U.S. PATENT DOCUMENTS

| | | | |
|---|---|---|---|
| 5,010,388 | 4/1991 | Sasame et al. | 357/70 |
| 5,049,969 | 9/1991 | Orbach et al. | 357/51 |
| 5,060,045 | 10/1991 | Owada et al. | 357/45 |

FOREIGN PATENT DOCUMENTS 57-45259  3/1982  Japan .

Primary Examiner—Frank Gonzalez
Attorney, Agent, or Firm—Laff, Whitesel, Conte & Saret

[57] ABSTRACT

A resin sealed semiconductor integrated circuit device has an upper wiring layer crossing over a lower wiring layer via an intermediate insulating film. Recesses or protrusions are formed at the side face of the upper wiring layer in the vicinity of its intersecting boundary with the lower wiring layer.

8 Claims, 3 Drawing Sheets

RESIN SEALED SEMICONDUCTOR INTEGRATED CIRCUIT DEVICE

BACKGROUND OF THE INVENTION

1. Field of the Invention

The present invention relates to a resin sealed semiconductor integrated circuit device which is obtained by sealing a semiconductor chip with resin.

2. Description of Related Art

The semiconductor chip is constructed by a plurality of electronic elements formed on a semiconductor substrate such as silicon substrate and wirings such as aluminum wirings which connect these electronic elements. These wirings are formed on the semiconductor substrate in two or more layers via intermediate insulating films of silicon dioxide or the like. Further, the surface of the semiconductor chip is coated with a nitride film or the like in order to protect the surface. Then, a resin sealing is provided to protect the semiconductor chip from damages caused by external forces or an ambient environment.

On the other hand, due to the difference in the coefficients of thermal expansion between silicon that constitutes the semiconductor chip and the resin that is the sealing material the semiconductor chip is subjected to a thermal stress during the operation of the semiconductor integrated circuit device or at the time of giving resin sealing, which may lead to a damage to the semiconductor integrated circuit device. In addition, because of the thermal stress, cracks are often generated in the protective film or the intermediate insulating films of the semiconductor chip, which may cause nonfunctioning of the semiconductor integrated circuit device.

Ordinarily, an aluminum material with high malleability and ductility is employed for the wirings of semiconductor integrated circuit devices, and for the sealing resin, an epoxy resin containing silica or the like is used. For example, when the temperature of the device is raised to 200° C. at the time of resin sealing and then cooled down to a normal temperature, the contraction stress of the sealing resin is applied as it is to be semiconductor chip. The contraction stress points along the surface of the semiconductor chip in the direction from the periphery toward the center of the semiconductor chip, so that especially at and near the corner portions of the semiconductor chip where the upper wiring and the lower wiring intersect perpendicularly with each other a maximum contraction stress acts in the direction toward the chip center bisecting the right angle formed by the intersecting wirings. Under the action of the contraction stress, the semiconductor substrate, the lower wiring, the intermediate insulating film, the upper wiring and the protective film are respectively deformed in the direction of the stress. However, the component with the largest amount of the deformation is the protective film in the uppermost layer, the amount of deformation decreasing as one moves downward, with less amount of deformation for the semiconductor substrate and the lower wiring.

Therefore, in the intersecting portions where the upper wiring overlaps with the lower wiring, the upper wiring and the protective film are shifted substantially toward the center of the semiconductor chip. The largest amount of shift may reach 3 to 5 $\mu$m for a semiconductor chip of 7 mm square. On the other hand, in the portion where the upper wiring and the lower wiring do not overlap, the degree of adhesion between the intermediate insulating film and the protective film is high due to their direct contact, and the degree of adhesion between the semiconductor substrate and the intermediate insulating film is also high, so that the amount of shift of the intermediate insulating film and the protective film is small being 1 to 2$\mu$m. As seen in the above, in the step part in the vicinity of the boundary where the upper wiring and the lower wiring intersect perpendicularly with each other, a deviation is generated due to the difference in the amounts of shift along the direction perpendicular to the protective film, so that there can be generated cracks not only in the protective film but also to the intermediate insulating film.

Japanese patent Laid Open No. 57-45259 discloses such a technique that holes or slits are formed within a guardband wiring layer to reduce crack failure produced in a passivation layer which is formed on the wiring layer. However, the prior art countermeasure is not effective to a multi-wiring layer structure.

SUMMARY OF THE INVENTION

It is an object of the present invention to provide a resin sealed semiconductor integrated circuit device which can prevent the generation of cracks in the protective film and the intermediate insulating film caused by a thermal stress or a contraction stress applied to the semiconductor chip at the time of sealing the semiconductor chip with resin, and suppress the occurrence of short-circuiting between the upper wiring and the lower wiring.

In the resin sealed semiconductor integrated circuit device in accordance with the present invention, a semiconductor chip is sealed with a resin. In such a semiconductor chip, electronic elements are formed on a semiconductor substrate, these electronic elements are connected to form a circuit by two or more multi-level of wiring layers via intermediate insulating films and the uppermost wiring layer is coated with a protective film. A thermal stress by the heating at the time of sealing with resin is applied to the semiconductor chip, and a contraction stress at the time of cooling down to the normal temperature is applied to the semiconductor chip. As a result, a large stress is applied to the protective film and the intermediate insulating film formed on the semiconductor chip. In order to prevent the progress of the cracks due to the stress a plurality of recesses or protrusions in the plan view are formed on the side face of the upper wiring layer that is brought into contact with the protective film. These recesses or protrusions are formed in the vicinity of the intersecting boundary of the upper wiring that intersects the lower wiring.

In accordance with the present invention, a plurality of recesses or protrusions are formed on the side face of the upper wiring layer so as to cross the lower wiring layer at right angles via the intermediate insulating film and the stress generated by expansion or contraction is dispersed by the corner parts of these recesses or protrusions, so that the generation of cracks in the protective film and the intermediate insulating film is made less easy to occur, thereby permitting to obtain a highly reliable resin sealed semiconductor integrated circuit device with excellent moisture resistance and no electrical short-circuiting.

BRIEF DESCRIPTION OF THE DRAWINGS

The above-mentioned and other objects, features and advantages of this invention will become more apparent by reference to the following detailed description of the invention taken in conjunction with accompanying drawings, wherein:

FIG. 7 shows other examples of plan shapes of the recess or protrusion where

DESCRIPTION OF THE EMBODIMENTS

Figure 1:
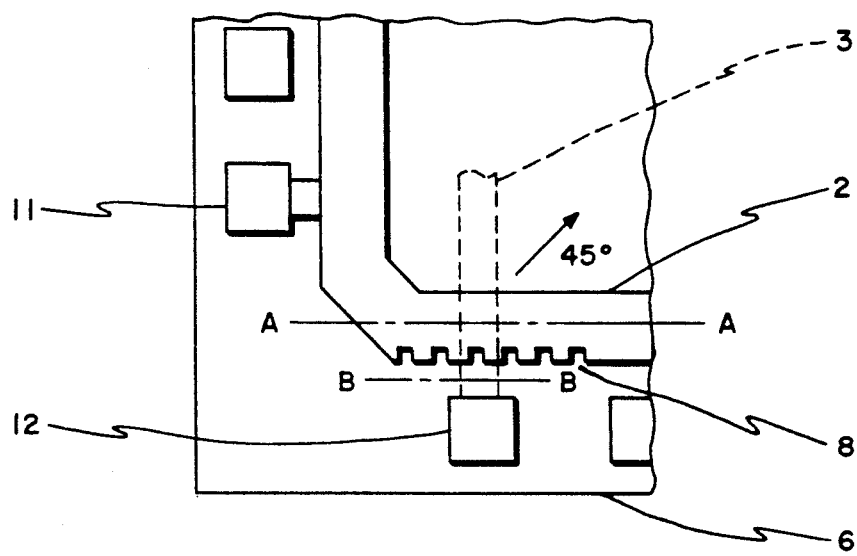
FIG. 1 is a partial plan view showing the internal structure of one embodiment in accordance with the present invention.

Referring to FIGS. 1, 2, 3 and 4, one embodiment of the present invention will be described. In the semiconductor chip which represents the principal part of the resin sealed semiconductor integrated circuit device in accordance with the present invention, a lower wiring layer 3 is formed on a field insulating layer of a semiconductor substrate 6 on which are formed electronic elements. An intermediate insulating film 4 is formed covering the lower wiring layer 3 and the surface of the semiconductor substrate 6, an upper wiring layer 2 is formed thereon, and finally the device is coated with a protective or a passivation film 5. This semiconductor chip is sealed with a resin 10 to obtain the resin sealed semiconductor integrated circuit device.

The upper wiring layer 2 and the lower wiring layer 3 that constitute a circuit along with the electronic elements are connected to bonding pads 11 and 12, respectively. The component materials for the semiconductor chip are: silicon of 7 mm square for the base of the semiconductor substrate, aluminum with thickness of 0.6 $\mu$m and width of 80 $\mu$m for the lower wiring layer 3, a silicon oxide film with thickness of 1 $\mu$m for the intermediate insulating film, aluminum with thickness of 1 $\mu$m and width of 100 $\mu$m for the upper wiring layer 2 and a nitride film with thickness of 0.8 $\mu$m for the protective film 5.

Figure 2:
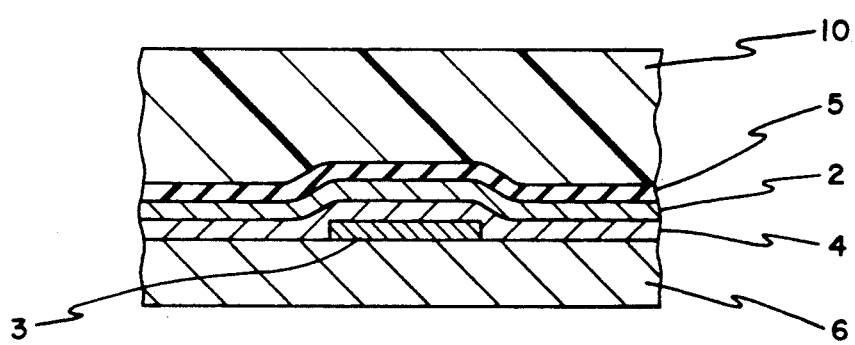
FIG. 2 is a cross-sectional view taken along the line A—A in FIG. 1.

As shown in FIG. 1, the semiconductor chip constructed as in the above has a plurality of portions where the lower wiring layer 3 and the upper wiring layer 2 intersect perpendicularly from each other. On the side faces of the upper wiring layer 2 in the intersecting part there are formed a plurality of recesses 8 with square plane shape. These recesses 8 are formed on the side face that is facing the outside of the semiconductor chip. As shown in FIG. 2, six pieces of the recess each having a width and a length respectively of 20 $\mu$m are formed with 70 $\mu$m pitch within a range that covers the step part that straddles the lower wiring layer 3. It should be mentioned that although it is effective if the recesses 8 are provided for all of the intersecting parts of the lower wiring layers 3 and the upper wiring layers 2, their formation may be limited only to the intersecting portions in the periphery of the semiconductor chip where the strain due to the stress is large.

Figure 3:
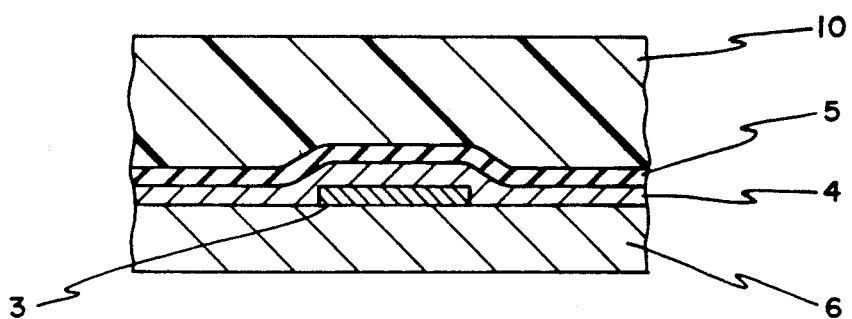
FIG. 3 is a cross-sectional view taken along the line B—B in FIG. 1.
Figure 6:
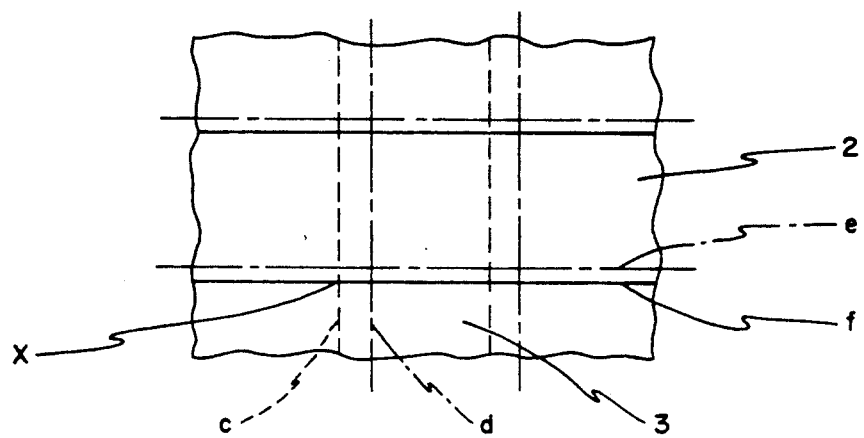
FIG. 6 is an enlarged plan view for illustrating the deviation of the protective film at the wiring intersecting part.

Next, the mechanism for the case when a thermal stress due to sealing with resin is applied to the semiconductor chip will be described. As shown in FIG. 3, in a portion where the lower wiring layer 3 and the upper wiring layer 2 are not intersecting, the adhesion between the intermediate insulating film 4 and the protective film 5 is high because they are brought into direct contact, and the generation of cracks is less easy to occur compared with the case of the intermediate insulating film 4 alone or the protective film 5 above, since the sum of their thickness in FIG. 3 is a large value of 1.8 $\mu$m. However, in the portion where the lower wiring layer 3 and the upper wiring layer 2 intersect with each other as shown in FIG. 2, when a stress acts in the direction of angle of 45° shown in FIG. 1, the protective film 5 is moved in the direction of the lower wiring layer 3 by the separation between the lines e and f, and is moved in the direction of the upper wiring 2 by the separation between the lines c and d, as shown in FIG. 6. A shearing force is generated in the protective film 5 due to the difference in the amounts of the shift, initiates a shear fracture at point X which is the intersecting boundary part between the upper wiring layer 2 and the lower wiring layer 3 prior to the application of the stress, generating a crack.

Figure 4:
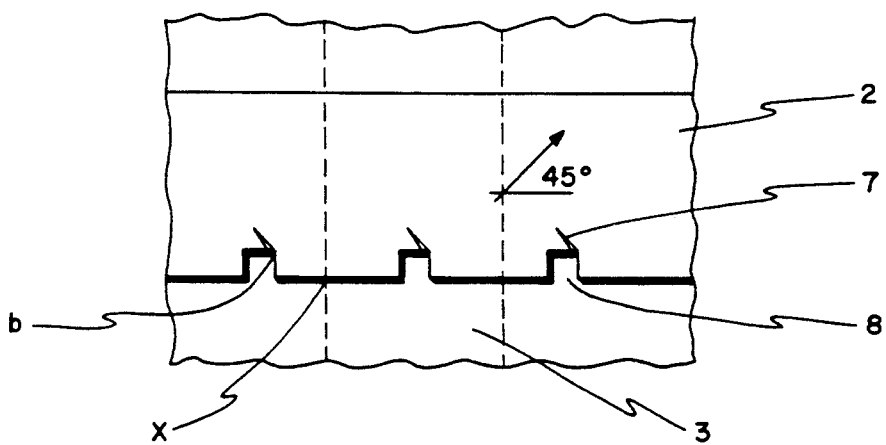
FIG. 4 is an enlarged plan view showing the intersecting part of the wirings in FIG. 1.

Further, when a stress acts at the intersecting part of the wiring layers in the direction of angle 45°, in the prior art, the shift of the protective film 5 is interrupted at the step part of the point X which is the boundary between the lower wiring layer 3 and the upper wiring layer 2, a particularly large stress acts on the point X, generating cracks in the protective film 5 or the intermediate insulating film 4. In contrast, in the present embodiment, the protective film 5 encroaches upon the plurality of recesses 8 so that the stress pointing toward the center of the semiconductor chip is dispersed to six sites and there will not be generated a crack at the point X. As shown in FIG. 4, even if cracks 7 are generated at points b within the recesses 8, the cracks are minor ones as indicated by 7 in the figure, and will not lead to a serious defect.

Figure 5:
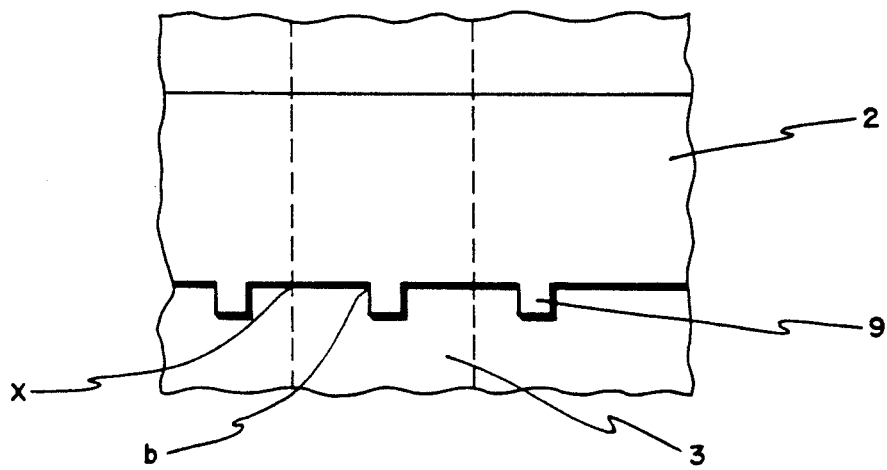
FIG. 5 is an enlarged plan view showing the wiring intersecting part of another embodiment of the present invention.

In FIG. 5 which shows another embodiment of the present invention, a plurality of protrusions 9 with width and length of 20 $\mu$m are formed with the arrangement same as in the above on the side faces of the upper wiring layer 2 in the intersecting boundary part between the upper wiring layer 2 and the lower wiring layer 3. Even if a stress acts on the intersecting part of the wiring layers in the 45° direction, the stress is dispersed to a plurality of points b, and there will not occur a crack that used to be generated at the point X of the step part of the intersecting boundary part.

Figure 7A:
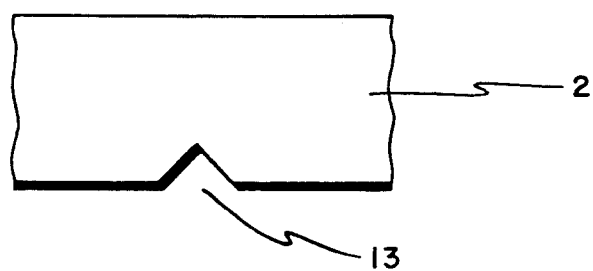
FIGS. 7(a), 7(b), 7(c) and 7(d) are respectively their enlarged plan views.
Figure 7B:
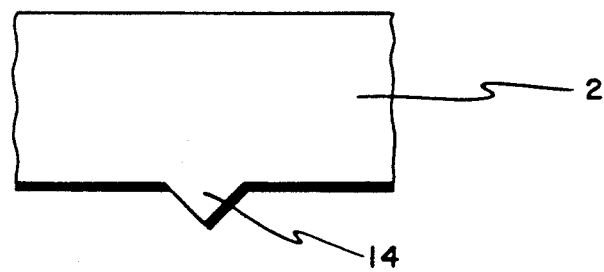
Figure 7C:
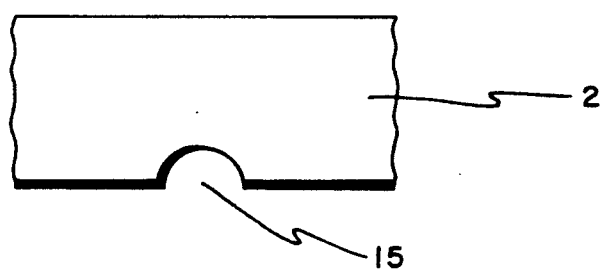
Figure 7D:
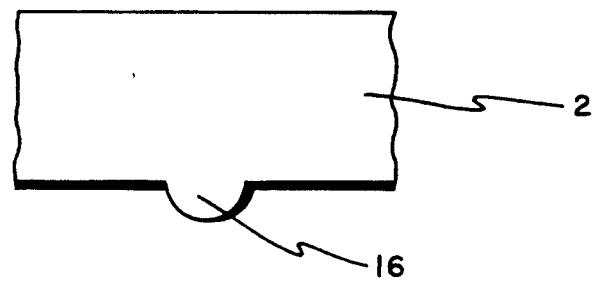

It should be noted that the embodiments in the above have been described in connection with the case of two layers, the present invention can also be applied to the case of two or more layers. Further, in the embodiments in the above the plan shape fo the recess or the protrusion is assumed to be square, but they may be triangular, 13 and 14, as shown in FIGS. 7(a) and 7(b) or arcuate, 15 and 16, as shown in FIGS. 7(c) and 7(d).

Although the invention has been described with reference to specific embodiments, this description is not meant to be construed in a limiting sense. Various modifications of the disclosed embodiments, as well as other embodiments of the invention, will become apparent by reference to the description of the invention. It is therefore contemplated that the appended claims will cover any modifications as fall within the true scope of the invention.

What is claimed is:

1. A resin sealed semiconductor integrated circuit device comprising:
   a semiconductor substrate;
   a first wiring layer formed on said substrate at a first level;
   an intermediate insulating film formed on said first wiring layer;
   a second wiring layer formed at a second level which is higher above said substrate than said first level, said second wiring layer crossing over said first wiring layer via said intermediate insulating film at one intersecting portion of said second wiring layer, said second wiring layer having a side face;
   a protective film covering said second wiring layer; and
   a resin sealing material coating said protective film, said first and second wiring layers, said intermediate insulating film and said substrate;
   wherein a plurality of recesses are formed on said side face of said second wiring layer at said intersecting portion and at portions of said second wiring layer in the vicinity of said intersecting portion.

2. A resin sealed semiconductor integrated circuit device as claimed in claim 1, wherein the plan shape of said recess is a square.

3. A resin sealed semiconductor integrated circuit device as claimed in claim 1, wherein the plan shape of said recess is a triangle.

4. A resin sealed semiconductor integrated circuit device as claimed in claim 1, wherein the plan shape of said recess is a circular arc.

5. A resin sealed semiconductor integrated circuit device comprising:
   a semiconductor substrate;
   a first wiring layer formed on said substrate at a first level;
   an intermediate insulating film formed on said first wiring layer;
   a second wiring layer at a second level which is higher above said substrate than said first level, said second wiring layer crossing over said first wiring layer via said intermediate insulating film at an intersecting portion of said second wiring layer, said second wiring layer having a side face;
   a protective film covering said second wiring layer; and
   a resin sealing material coating said protective film, said first and second wiring layers, said intermediate insulating film and said substrate;
   a plurality of protrusions being formed on said side face of said second wiring layer at said intersecting portion and at portions of said second wiring layer in the vicinity of said intersecting portion.

6. A resin sealed semiconductor integrated circuit device as claimed in claim 5, wherein the plan shape of said protrusion is a square.

7. A resin sealed semiconductor integrated circuit device as claimed in claim 5, wherein the plan shape of said protrusion is a triangle.

8. A resin sealed semiconductor integrated circuit device as claimed in claim 5, wherein the plan shape of said protrusion is a circular arc.

* * * * *